(12) United States Patent
Huang et al.

(10) Patent No.: US 7,102,218 B2
(45) Date of Patent: Sep. 5, 2006

(54) SEMICONDUCTOR PACKAGE WITH CHIP SUPPORTING STRUCTURE

(75) Inventors: Jung-Pin Huang, Taichung (TW); Chin-Thuang Chang, Taichung (TW); Chin-Tien Chiu, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 0 days.

(21) Appl. No.: 10/355,540

(22) Filed: Jan. 31, 2003

(65) Prior Publication Data

US 2004/0099931 A1 May 27, 2004

(30) Foreign Application Priority Data

Nov. 21, 2002 (TW) .................... 91133919 A

(51) Int. Cl.
H01L 23/02 (2006.01)
H01L 27/06 (2006.01)
H01L 21/44 (2006.01)

(52) U.S. Cl. .............. 257/686; 257/692; 257/696; 257/783

(58) Field of Classification Search ........ 257/532, 257/666, 676, 778, 782, 672, 700, 686; H01L 23/02
See application file for complete search history.

(56) References Cited

U.S. PATENT DOCUMENTS

| | | | |
|---|---|---|---|
| 5,212,402 A * | 5/1993 | Higgins, III | 257/532 |
| 5,214,307 A * | 5/1993 | Davis | 257/676 |
| 5,233,222 A | 8/1993 | Djennas et al. | 257/676 |
| 5,327,008 A | 7/1994 | Djennas et al. | 257/666 |
| 5,521,428 A | 5/1996 | Hollingworth et al. | 257/670 |
| 5,770,480 A * | 6/1998 | Ma et al. | 438/123 |
| 5,849,608 A * | 12/1998 | Abe | 438/123 |
| 6,087,715 A * | 7/2000 | Sawada et al. | 257/666 |
| 6,087,718 A * | 7/2000 | Cho | 257/686 |
| 6,191,490 B1 * | 2/2001 | Huang | 257/782 |
| 6,373,142 B1 * | 4/2002 | Hoang | 257/783 |
| 6,483,181 B1 * | 11/2002 | Chang et al. | 257/686 |
| 6,507,120 B1 * | 1/2003 | Lo et al. | 257/778 |

\* cited by examiner

Primary Examiner—David Nelms
Assistant Examiner—Dao H. Nguyen
(74) Attorney, Agent, or Firm—Peter F. Corless; Steven M. Jensen; Edwards Angell Palmer & Dodge, LLP

(57) ABSTRACT

A semiconductor package with a chip supporting structure is provided, including a lead frame having a die pad and a plurality of leads, and a plurality of chip supporting members mounted on the die pad. Each of the chip supporting members has a first surface and an opposing second surface and has an identical height. After the second surfaces of the chip supporting members are attached to the die pad, the first surfaces of the chip supporting members are coplanarly arranged, and a chip is mounted on the first surfaces of the chip supporting members, making the chip supporting members interposed between the chip and die pad. A molding resin for encapsulating the chip is allowed to penetrate through and fill into gaps between the chip and die pad, so as to prevent void formation and assure quality of fabricated products.

8 Claims, 4 Drawing Sheets

SEMICONDUCTOR PACKAGE WITH CHIP SUPPORTING STRUCTURE

FIELD OF THE INVENTION

The present invention relates to semiconductor packages, and more particularly, to a semiconductor package using a die pad of a lead frame as a chip carrier, especially applicable to a lead frame with a window pad.

BACKGROUND OF THE INVENTION

A lead-frame-based semiconductor package using a lead frame as a chip carrier usually renders a reliability issue in terms of thermal stresses being generated due to mismatch in CTE (coefficient of thermal expansion) between a chip and a silver paste for attaching the chip to the lead frame and between the silver paste and the lead frame. In particular, the chip is mounted on a die pad of the lead frame via the silver paste and encapsulated by an encapsulant; due to different CTEs (chip: about 4 ppm, silver paste: about 40 ppm, die pad: about 16 ppm), significant thermal stresses would be induced at interfaces between the chip and silver paste and between the silver paste and die pad, such that under temperature variation in a reliability test or practical operating environment, the semiconductor package may be subject to delamination and chip cracks by effect of thermal stresses, making quality of the semiconductor package undesirably degraded. This situation is more severe in the use of a larger die pad or chip in which contact area between the die pad and chip is increased and the die pad would suffer greater thermal stresses during a temperature cycle, thereby resulting in warpage and poor planarity of the die pad and further causing delamination between the chip and die pad.

In response to the above problems, U.S. Pat. Nos. 5,233,222, 5,327,008 and 5,521,428 disclose a semiconductor package having a die pad being formed with at least an opening. As shown in FIGS. 9A and 9B, this semiconductor package 4 utilizes a die pad 400 formed with at least an opening 402 of a flexible shape such as round, rectangle, square, etc. As such, when a chip 42 is mounted on the die pad 400 via a silver paste 45, the chip 42 covers the opening 402 with its non-active surface being partly exposed to the opening 402, making area applied with the silver paste 45 between the chip 42 and die pad 400 effectively reduced; this thereby reduces thermal stress effect on the chip 42 and die pad 400 so as to prevent delamination between the same or chip cracks from occurrence. In another aspect, with provision of the opening 402, the chip 42 would be indirect contact with a molding compound (CTE: about 14 ppm) used for forming an encapsulant 44 that encapsulates the chip 42; relatively smaller CTE mismatch between the chip 42 and encapsulant 44 helps prevent delamination and thereby assures structural intactness of the semiconductor package 4 during fabrication processes.

Besides the above benefits accomplished by the semiconductor package 4, however, during a process for applying the silver paste 45 used to attach the chip 42 to the die pad 400, it is necessary to precisely control an applied amount of the silver paste 45 in order not to affect subsequent packaging processes of the chip 42. As shown in FIG. 10A, if an excess amount of silver paste 45 is used, when the chip 42 is mounted on and presses on the silver paste 45, a portion of the silver paste 45 would leaks downwardly from a periphery of the opening 402 and flashes to a bottom surface of the die pad 400, which would adversely affect bonding between the bottom surface of the die pad 400 and the encapsulant 44.

On the other hand, as shown in FIG. 10B, if an insufficient amount of silver paste 45 is applied, gaps G may be formed between the chip 42 and die pad 400 and normally of a size smaller than 1 mil (about 25.4 μm). Such gaps G failed to be filled or penetrated by a resin compound whose filler size is usually larger than 1 mil during a molding process for fabricating the encapsulant 44. Moreover, these considerably small gaps G would impede flowing of the resin compound, making air trapped between the chip 42 and die pad 400 not capable of being dissipated and thus form voids, such that the encapsulant 44 may encounter popcorn effect by virtue of voids in a high temperature environment and thus damages structures of the chip 42 and semiconductor package 4. Therefore, either flashes of the silver paste 45 or formation of voids would undesirably affect yield and reliability of fabricated package products. However, in respect of precisely controlling a used amount of the silver paste 45, it requires improvement in process accuracy or preciseness and thereby increases fabrication costs, which still may not completely eliminate the occurrence of paste flashes or voids.

Moreover, the above die pad 400 formed with the opening 402 needs to be fabricated in compliance with size and shape of the chip 42, making fabrication costs undesirably increased. For a highly integrated chip of a larger size, if such a larger chip is directly attached to the die pad, this would increase contact area between the chip and die pad and thermal stress effect on the chip and die pad, making adhesion at interfaces between the chip and silver paste and between the silver paste and die pad adversely degraded.

SUMMARY OF THE INVENTION

A primary objective of the present invention is to provide a semiconductor package with a chip supporting structure, which can prevent direct contact between a chip and a die pad, to thereby eliminate chip cracks, delamination between the chip and die pad, and warpage of the die pad in response to thermal stresses, so as to improve quality of the semiconductor package.

Another objective of the invention is to provide a semiconductor package with a chip supporting structure, whereby it is not necessary to fabricate a die pad in compliance with profile of a chip, such that process complexity and costs can be reduce for fabrication of the semiconductor package.

A further objective of the invention is to provide a semiconductor package with a chip supporting structure, which allows a molding compound to fill into gaps between a chip and a die pad to eliminate formation of voids in the gaps.

A further objective of the invention is to provide a semiconductor package with a chip supporting structure for effectively preventing flashes of a silver paste over unintended area such as a bottom surface of a die pad in the semiconductor package.

In accordance of the foregoing and other objectives, the present invention proposes a semiconductor package with a chip supporting structure, comprising: a lead frame having at least a die pad and a plurality of leads; a plurality of chip supporting members each having a first surface and a second surface opposed to the first surface and each having an identical height, wherein the second surfaces of the chip supporting members are attached to the die pad, making the first surfaces of the chip supporting members flush with each other; a chip mounted on the first surfaces of the chip supporting members and electrically connected to the lead frame; and an encapsulant for encapsulating the chip supporting members, chip and lead frame.

The chip supporting members can be flexibly sized and provided in a quantity thereof. In order to allow a molding compound used for forming the encapsulant to penetrate through gaps between the chip and die pad, each of the chip support members preferably has a height larger than a minimum distance (generally about 3 mils) capable of being penetrated by fillers of the molding resin.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package with a chip supporting structure proposed in the present invention are described in detail with reference to FIGS. 1 to 8.

First Preferred Embodiment

Figure 1:
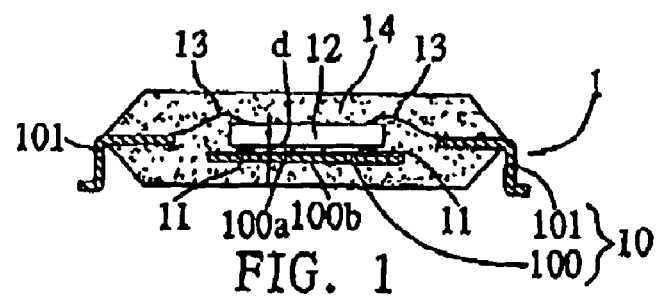
FIG. 1 is a cross-sectional view of a semiconductor package according to a first preferred embodiment of the invention.

As shown in FIG. 1, the semiconductor package 1 with a chip supporting structure according to a first preferred embodiment of the invention includes a lead frame 10 having at least a die pad 100 and a plurality of leads 101; a plurality of chip supporting members 11 attached to the die pad 100; a chip 12 mounted on the chip supporting members 11; a plurality of bonding wires 13 (such as gold wires) for electrically connecting the chip 12 to the leads 101; and an encapsulant 14 for encapsulating the chip supporting members 11, chip 12, bonding wires 13 and part of the lead frame 10.

The lead frame 10 is made of a metal material such as copper or copper alloy, and is composed of a die pad 100 and a plurality of leads 101 around the die pad 100. The die pad 100 can be a full pad, or a window pad formed with at least an opening penetrating through a top surface 100a and a bottom surface 100b of the die pad 100; such an opening can be flexibly shaped as round, rectangle, square or X-shape, etc.

Figure 2:
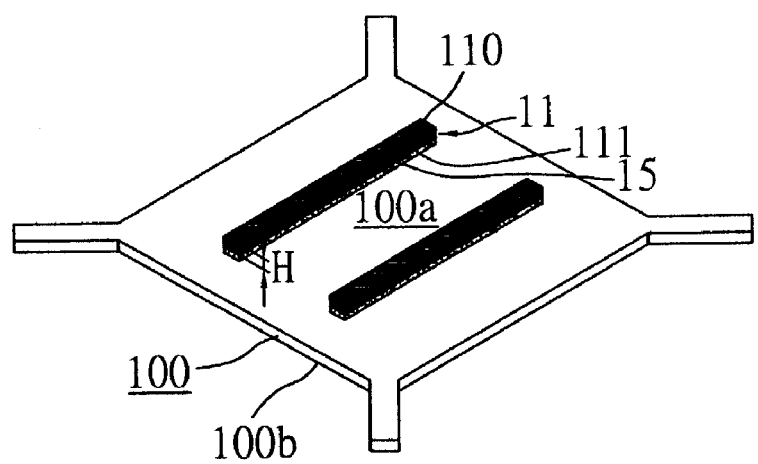
FIG. 2 is a perspective view showing chip supporting members mounted on a lead frame in the semiconductor package according to the invention.

The chip supporting member 11 can be made of a dummy die of a material same as the chip 12, a metal plate (such as copper, aluminum, etc.), or a polymer material having a coefficient of thermal expansion (CTE) similar to that of the chip 12. In this embodiment, as shown in FIG. 2, the chip supporting member 11 can be a cylindrical or square column processed by cutting and grinding, and has a first surface 110 and a second surface 111 opposed to the first surface 110. Each of the plurality of chip supporting members 11 has an identical height H. A silver paste 15 is applied over the second surfaces 111 of the chip supporting members 11 for attaching the plurality of chip supporting members 11 to the top surface 100a of the die pad 100 in a manner that the first surfaces 110 of the chip supporting members 11 are flush with each other. Therefore, during a die-bonding process, the silver paste 15 can be simultaneously applied over the first surfaces 110 of the chip supporting members 11 for mounting the chip 12 thereon by which the chip supporting members 11 are interposed between the chip 12 and die pad 100 and space apart the chip 12 and die pad 100 by a distance d, as shown in FIG. 1. The height H of the chip supporting member 11 is larger than a minimum distance (generally about 3 mils) capable of being penetrated by fillers of a resin used for forming the encapsulant 14.

Figure 3:
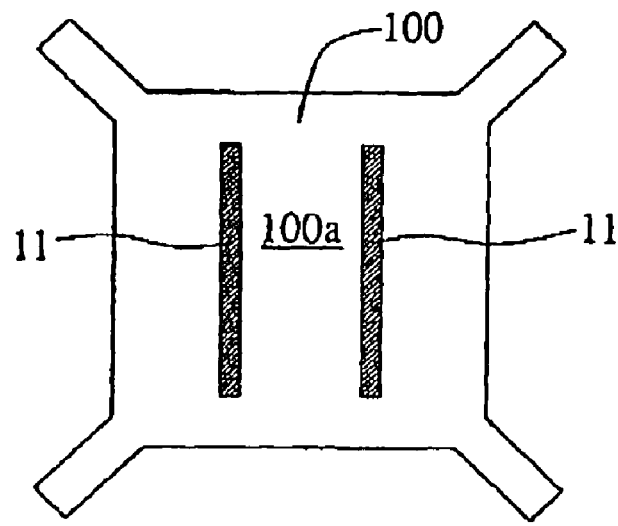
FIG. 3 is a top view showing two strips of chip supporting members arranged on the lead frame in the semiconductor package according to the invention.
Figure 4:
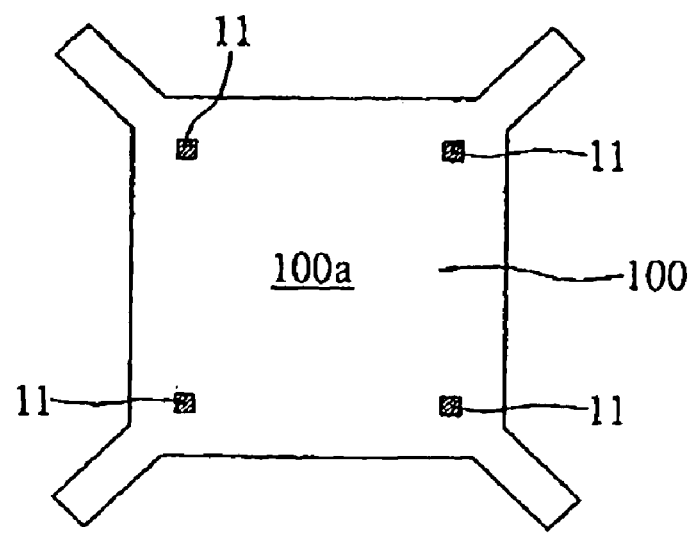
FIG. 4 is a top view showing four chip supporting members disposed at corner portions on the lead frame in the semiconductor package according to the invention.
Figure 5:
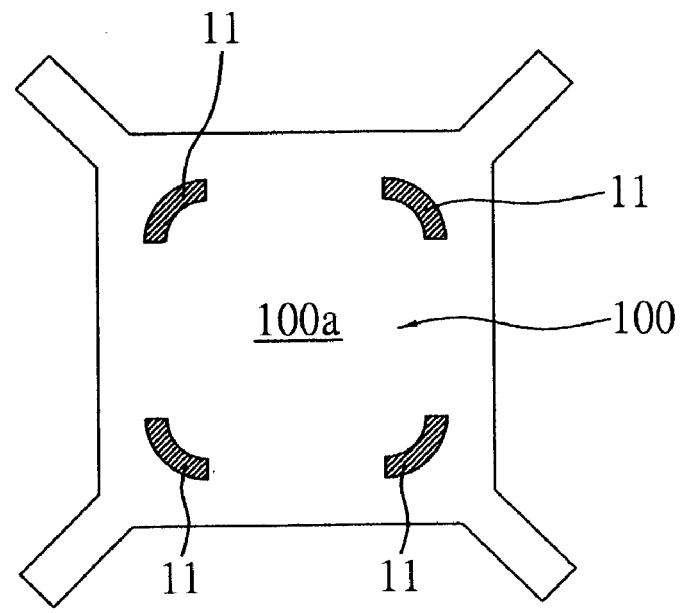
FIG. 5 is a top view showing chip supporting members disposed at positions on the lead frame corresponding to corners of a chip in the semiconductor package according to the invention.

Moreover, the chip supporting members 11 are flexibly arranged on the die pad 100 in two strips (as shown in FIG. 3), at four corner portions (as shown in FIG. 4), or at other positions easily subject to delamination (such as positions corresponding to chip corners, as shown in FIG. 5). Under a condition not to affect attachment between the chip 12 and die pad 100, each of the chip supporting members 11 can be flexibly shaped and oriented without particular limitation.

Therefore, as the chip 12 is elevated above the die pad 100 via the chip supporting members 11 by a height difference, during a molding process for fabricating the encapsulant 14, a melted molding resin (not shown) can fill into gaps between the chip 12 and die pad 100 without forming voids in the gaps, thereby helping assure reliability of fabricated package products. Furthermore, as contact area between the chip 12 and chip supporting members 11 and between the die pad 100 and chip supporting members 11 can be effectively decreased, it would facilitate reduction of thermal stress effect generated under a subsequent temperature cycle, thereby preventing chip cracks and delamination at attachment interfaces in the semiconductor package 1.

Second Preferred Embodiment

Figure 6:
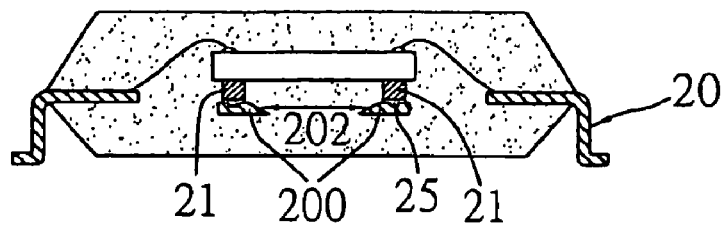
FIG. 6 is a cross-sectional view of a semiconductor package according to a second preferred embodiment of the invention.

FIG. 6 illustrates a semiconductor package according to a second preferred embodiment of the invention. As shown in the drawing, this semiconductor package is similar in structure to that of the first preferred embodiment, with the difference in that the die pad 200 is formed with at least an opening 202, and a periphery of the opening 202 can be shaped as stairs or gradients without particular limitation; this is to help reduce flow resistance during filling of a molding resin (not shown) and prevent formation of voids in gaps between the chip supporting members 21 being filled by the molding resin. Moreover, the opening 202 with the stair- or gradient-shaped periphery can also anchor the silver paste 25 and prevent the silver paste 25 from contaminating unintended area such as a bottom surface of the die pad 200 and leading to delamination. It should be understood that, besides formation of the opening 202, other structural designs or arrangements of the die pad 200 without affecting incorporation of the chip supporting member 21 on the die pad 200 are also included within the scope embraced by this invention.

Third Preferred Embodiment

Figure 7:
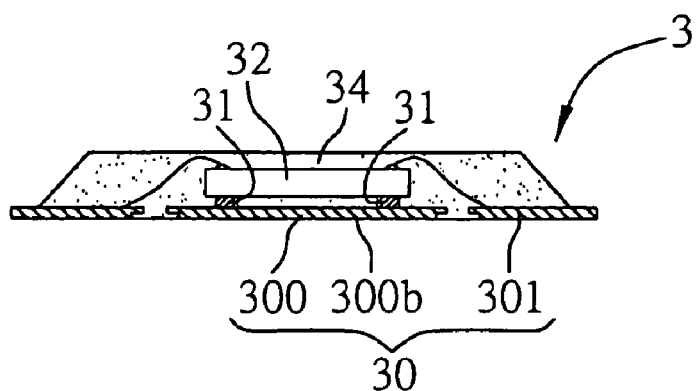
FIG. 7 is a cross-sectional view of a semiconductor package according to a third preferred embodiment of the invention.
Figure 8:
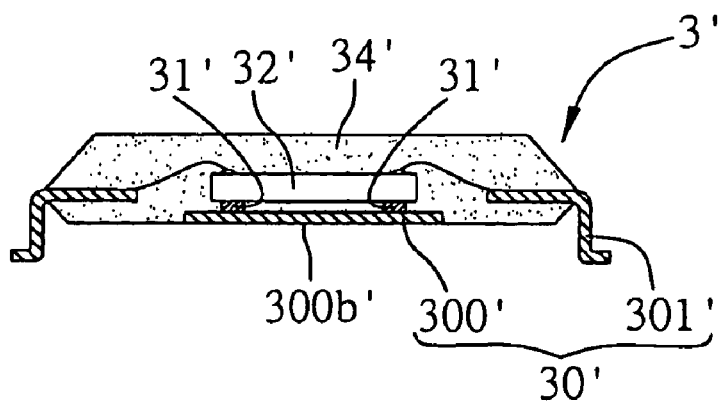
FIG. 8 is a cross-sectional view of another example of the semiconductor package according to the third preferred embodiment of the invention.
Figure 9A:
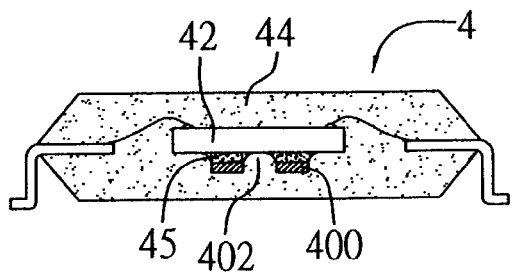
FIG. 9A (PRIOR ART) is a cross-sectional view of a semiconductor package having a die pad formed with an opening.
Figure 9B:
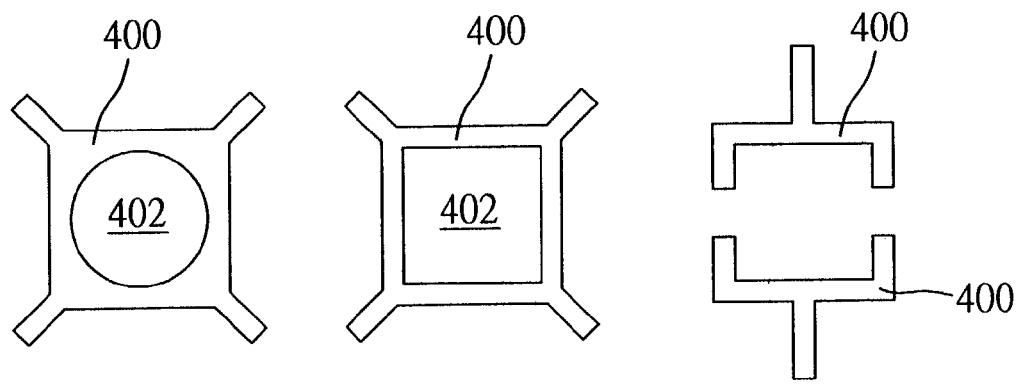
FIG. 9B (PRIOR ART) is a top view of a conventional die pad formed with an opening or a discontinuous U-shaped die pad.
Figure 10A:
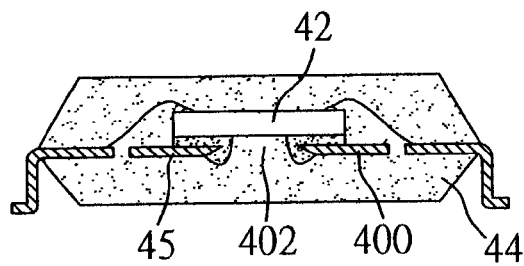
FIG. 10A (PRIOR ART) is a cross-sectional view of a semiconductor package in which an excess amount of silver paste is applied for attaching a chip to a die pad.
Figure 10B:
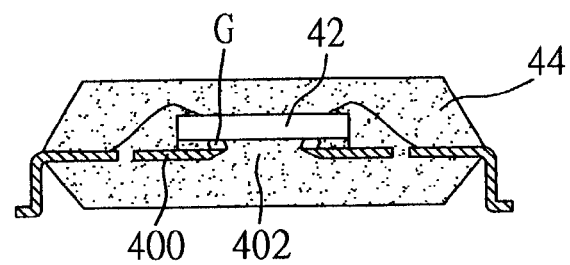
FIG. 10B (PRIOR ART) is a cross-sectional view of a semiconductor package in which an insufficient amount of silver paste is applied for attaching the chip to the die pad.

FIGS. 7 and 8 illustrate a semiconductor package according to a third preferred embodiment. This semiconductor package 3, 3' is similar in structure to that of the first preferred embodiment, with the difference in that the lead frame 30, 30' is suitably used in a quad flat non-leaded (QFN) package 3 or an exposed pad package 3'. As shown in FIG. 7, the die pad 300 and leads 301 of the lead frame 30 in the QFN package 3 are coplanarly arranged, and a bottom surface 300b of the die pad 300 and bottom surfaces of the leads 301 are exposed to outside of the encapsulant 34. As shown in FIG. 8, for the lead frame 30' in the exposed pad package 3', a bottom surface 300b' of the die pad 300' is also exposed to outside of the encapsulant 34' and helps enhance heat dissipating efficiency for the chip 32'. Moreover, since the chip supporting members 31, 31' can be mounted at any desirable positions on the die pad 300, 300', it can be applicable in other types of package structures such as QFP (quad flat package), SOP (small outline package), DIP (dual inline package) and other lead-frame-based packages in which the chip supporting members 31, 31' space apart the chip 32, 32' and die pad 300, 300' to facilitate penetration and flowing of a resin compound under the chip 32, 32'.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a chip supporting member, comprising:

a lead frame having at least a die pad and a plurality of leads;

a plurality of chip supporting members each having a first surface and a second surface opposed to the first surface and each having an identical height, wherein the second surfaces of the chip supporting members are attached to the die pad, making the first surfaces of the chip supporting members flush with each other;

a chip having a first surface and a second surface opposed to the first surface, wherein the second surface of the chip is mounted on the first surfaces of the chip supporting members, and the first surface of the chip is electrically connected to the lead frame; and an encapsulant formed by a resin for encapsulating the chip supporting members, the chip and the lead frame;

wherein the chip supporting members are interposed between the chip and the die pad, and the chip is spaced apart from the die pad by the chip supporting members, each of the chip supporting members having a height larger than about 3 mils for accommodating a size of fillers of the resin and made of a material having a coefficient of thermal expansion similar to that of the chip, wherein the material of each of the chip supporting members is selected from a group consisting of a dummy die of a same material as the chip, a copper plate, and a polymer material having the coefficient of thermal expansion similar to that of the chip.

2. The semiconductor package of claim 1, wherein the semiconductor package is a quad flat non-leaded (QFN) package.

3. The semiconductor package of claim 1, wherein the semiconductor package is an exposed pad package.

4. The semiconductor package of claim 1, wherein the die pad is a full pad.

5. The semiconductor package of claim 1, wherein the die pad is a window pad formed with at least an opening.

6. The semiconductor package of claim 1, wherein two strips of the chip supporting members are arranged on the die pad.

7. The semiconductor package of claim 1, wherein the plurality of chip supporting members are disposed at corner portions on the die pad.

8. The semiconductor package of claim 1, wherein the first surface of the chip is electrically connected to the lead frame by a plurality of bonding wires.

* * * * *